US006376262B1

United States Patent
Kempa et al.

(10) Patent No.: US 6,376,262 B1
(45) Date of Patent: Apr. 23, 2002

(54) METHOD OF FORMING A SEMICONDUCTOR DEVICE USING DOUBLE ENDPOINT DETECTION

(75) Inventors: Danielle Ki'ilani Kempa, Ogunquit, ME (US); Sandra Hyland, Falls Church, VA (US)

(73) Assignees: National Semiconductor Corporation, Santa Clara, CA (US); Tokyo Electron Limited (JP)

(*) Notice: Subject to any disclaimer, the term of this patent is extended or adjusted under 35 U.S.C. 154(b) by 0 days.

(21) Appl. No.: 09/872,636

(22) Filed: May 31, 2001

(51) Int. Cl.$^7$ ............................................... H01L 21/00
(52) U.S. Cl. ............................................................... 438/8
(58) Field of Search ........................... 438/8, 5–7, 9–13, 438/14–18, 800

(56) References Cited

U.S. PATENT DOCUMENTS 4,675,072 A * 6/1987 Bennett et al. ............. 156/626

OTHER PUBLICATIONS

Derwent Acc No. 1987–192034 Bennet, R.S. et al. "Dual-layer plasma etching end point detection appts.—uses laser irradiation and sec. emission detection of a minority species . . . ".*

Unity, EPD202 Functional Specification, Rev. 2.0., pp. 1–40. No date.

C.K. Hanish et al., "Modeling and Algorithm Development for Automated Optical Endpointing of an HBT Emitter Etch", Journal of Electronic Materials, vol. 26, No. 12, 1997, pp. 1401–1408.

G.G. Gifford, "Applications of Optical Emission Spectroscopy in Plasma Manufacturing Systems", SPIE vol. 1392 Advanced Techniques for Integrated Circuit Processing, 1990, pp. 454–465.

* cited by examiner

*Primary Examiner*—Charles Bowers
*Assistant Examiner*—Craig Thompson
(74) *Attorney, Agent, or Firm*—Pillsbury Winthrop LLP

(57) ABSTRACT

An optical endpoint system controls the overetching of a semiconductor device by using double optical endpoint detection. With a complex spacer, the system monitors the chemistry change at both the top TEOS/nitride interface and the bottom nitride/TEOS interface. This double optical endpoint method reduces the possibility of overetching the layers regardless of the variations in the thickness of the incoming film or the etching characteristics of the etch chamber.

24 Claims, 7 Drawing Sheets

METHOD OF FORMING A SEMICONDUCTOR DEVICE USING DOUBLE ENDPOINT DETECTION

BACKGROUND OF THE INVENTION

1. Field of the Invention

The present invention relates to a method of forming a semiconductor device and, more particularly, to a method of forming a semiconductor device using double endpoint detection.

2. Description of the Related Art

A side wall spacer is a region of material that adjoins the gate of a MOS transistor to electrically isolate the gate from adjacent structures. Side wall spacers are also commonly used during the fabrication of MOS transistors to partially define the areas where the heavily-doped source and drain regions are formed.

FIG. 1 shows a cross-section diagram that illustrates a standard MOS transistor 100. As shown in FIG. 1, MOS transistor 100, which is formed in a p-substrate 110, includes spaced-apart n-type source and drain regions 112 and 114 which are formed in substrate 110, and a channel region 116 that is defined between source and drain regions 112 and 114.

MOS transistor 100 also includes a layer of gate oxide 120 that is formed over channel region 116, and a gate 122 that is formed on gate oxide layer 120 over channel region 116. In addition, a side wall spacer 124 is formed to adjoin the side walls of gate 122 (spacer 124 contacts all four side walls of gate 122). Side wall spacer 124 is conventionally formed by depositing a layer of oxide over substrate 110 and gate 122, and then anisotropically (vertically) etching the oxide until the oxide is removed from the top surface of gate 122.

Although side wall spacer 124 is a common solution for devices with larger feature sizes, e.g., 0.5 microns and above, a complex side wall spacer has been suggested for use in devices with smaller feature sizes, e.g., 0.18 microns. Complex side wall spacers utilize an "L"shaped layer of nitride to dictate the implant junction location of the transistor.

FIG. 2 shows a cross-section diagram that illustrates a MOS transistor 200 with a prior-art complex side wall spacer. Transistor 200 is similar to transistor 100 and, as a result, utilizes the same reference numerals to designate the structures that are common to both transistors.

As shown in FIG. 2, MOS transistor 200 differs from MOS transistor 100 in that transistor 200 utilizes a complex side wall spacer 210. Spacer 210, in turn, includes an L-shaped insulation layer 212 that adjoins gate 122, an L-shaped nitride layer 214 that is formed on layer 212, and a pie or wedge-shaped insulation layer 216 that is formed on nitride layer 214.

One of the advantages that spacer 210 provides over spacer 124 is that spacer 210 provides greater consistency in transistor parametrics. This, in turn, increases the reliability of the transistors and the manufacturing yield. The complex side wall spacer also has the advantage of being formed with low-temperature processing steps.

FIGS. 3A–3D show cross-sectional diagrams that illustrate a prior-art method 300 of forming transistor 200. As shown in FIG. 3A, method 300 utilizes a wafer 310 that has been partially-processed to have a p-substrate 312, and a layer of gate oxide 314 that is formed on substrate 312. In addition, wafer 310 also has a gate 316 that is formed on gate oxide layer 314.

Method 300 begins by implanting substrate 312 and gate 316 with an n-type dopant to form n-source and drain regions 320 and 322 in substrate 312, and dope gate 316. Following this, as shown in FIG. 3B, a layer of tetraethylorthosilicate (TEOS) 324 approximately 300Å thick is formed on oxide layer 314 and gate 316.

Next, a layer of nitride 326 approximately 300Å–500Å thick is formed on TEOS layer 324. Once nitride layer 326 has been formed, a layer of TEOS 328 approximately 5,000Å thick is formed on nitride layer 326. The actual thickness of each deposited layer (TEOS layer 324, nitride layer 326, and TEOS layer 328) can vary from wafer to wafer, and from lot to lot by up to 10%. Since TEOS layer 328 is the thickest, this is most pronounced in TEOS layer 328. This is illustrated in FIG. 3B with two different thicknesses of TEOS layer 328.

Following this, as shown in FIG. 3C, TEOS layer 328 is anisotropically etched for a predetermined period of time (the etch time) to remove TEOS layer 328 from nitride layer 326 over gate 316 and the peripheral region of substrate 312. The etch time for a layer of material is calculated by considering the expected variation in the incoming film thickness and in the etch rate of the reactive ion etch (RIE) chamber.

The etch time must take into account the worst-case film thickness, i.e., a film that is on the thick side of the film thickness specification (film thickness varies from wafer-to-wafer and lot-to-lot). In addition, the etch time must also take into account the worst-case etch rate, i.e., an etch rate that is on the slow side of the etch rate specification (etch rates will vary depending on chamber condition- newly cleaned to end-of-cycle).

Next, as shown in FIG. 3D, nitride layer 326 is anisotropically etched for a predetermined period of time (the etch time) to remove nitride layer 326 from TEOS layer 324 over gate 316 and the peripheral region of substrate 312. The etch time of nitride layer 326 is determined in the same manner as the etch time of TEOS layer 328. After this, a source and drain implant is performed through TEOS layer 324. The implant forms n+source and drain regions 330 and 332 in substrate 312, and again dopes gate 316.

One problem with method 300, however, is that since TEOS layer 328 can have a significant variation in thickness, and layers 314, 324, and 326 are relatively thin, a timed etch will occasionally be too long and etch through layers 314, 324, and 326 into substrate 312. The trenching of substrate 312, in turn, often leads to inoperable devices due to variations in the implant depth. Thus, it is essential to the success of the L-shaped spacer to consistently etch the same amount into TEOS layer 324.

One approach to this over etch problem is to use optical endpoint detection in lieu of timing the etch. The use of optical endpoint detection is well known, and commercial systems that are reliable in manufacturing have been available for a number of years. One example is the TEL EPD 202 manufactured by Tokyo Electron Limited.

In operation, optical endpoint detection systems monitor the optical components of the plasma during an etch. Some of the optical components, in turn, are specific to the material that is etched. Thus, by monitoring a wavelength of light that is specific to the material being etched, the system can detect when one film has been removed from another film.

For example, a strong peak at 387 nm indicates that CN is present in the plasma, usually indicating that nitride is being etched. Thus, by monitoring the intensity of the light at 387 nm during the etch of nitride layer 326, the etch can be stopped when the intensity of the light at 387 nm decreases to a point that corresponds with the necessary removal of nitride layer 326.

Thus, where a timed etch would continue even though nitride layer 326 had been completely removed from over gate 316 and the peripheral area, an optical endpoint system stops the etch as soon as the nitride has been removed. As a result, optical endpoint detection systems improve the uniformity of the final thickness of TEOS layer 324 and reduce the likelihood that the substrate or surface silicon will be trenched or roughened during the etch.

Although satisfactory results can be obtained by using an optical endpoint detection system, there is a need for additional methods of forming complex side wall spacers.

SUMMARY OF THE INVENTION

The present invention provides a method of forming a semiconductor device, such as complex side wall spacers and other structures, that utilizes optical endpoint detection to stop the last n etches used to form the spacers or other structures, where n is equal to or greater than two. As a result, the present invention substantially prevents non-uniformities from the previous layers from being introduced into the remaining layer. This, in turn, improves the uniformity across the wafer, from wafer-to-wafer, and from lot to lot.

The method of the present invention, which forms a semiconductive device on a semiconductor material of a first conductivity type, includes the step of forming a first layer of material on the semiconductor material. The method also includes the steps of forming a second layer of material on the first layer of material, and forming a third layer of material on the second layer of material.

The method further includes the steps of etching the third layer of material until a first wavelength of light changes from a first intensity to a second intensity, and etching the second layer of material until a second wavelength of light changes from a third intensity to a fourth intensity.

In addition, the third layer of material is etched in an etching chamber that has an etching chemistry, and the etching chemistry is set to etch the third layer of material. Further, the second layer of material is etched in the etching chamber, and the etching chemistry is changed to etch the second layer of material in response to the first wavelength of light changing from the first intensity to the second intensity.

A better understanding of the features and advantages of the present invention will be obtained by reference to the following detailed description and accompanying drawings that set forth an illustrative embodiment in which the principles of the invention are utilized.

DETAILED DESCRIPTION

FIGS. 4A–4D show cross-sectional diagrams that illustrate a method 400 of forming transistor 200 in accordance with the present invention. As described in greater detail below, the present invention forms complex side wall spacers by utilizing double optical endpoint detection.

Figure 1:
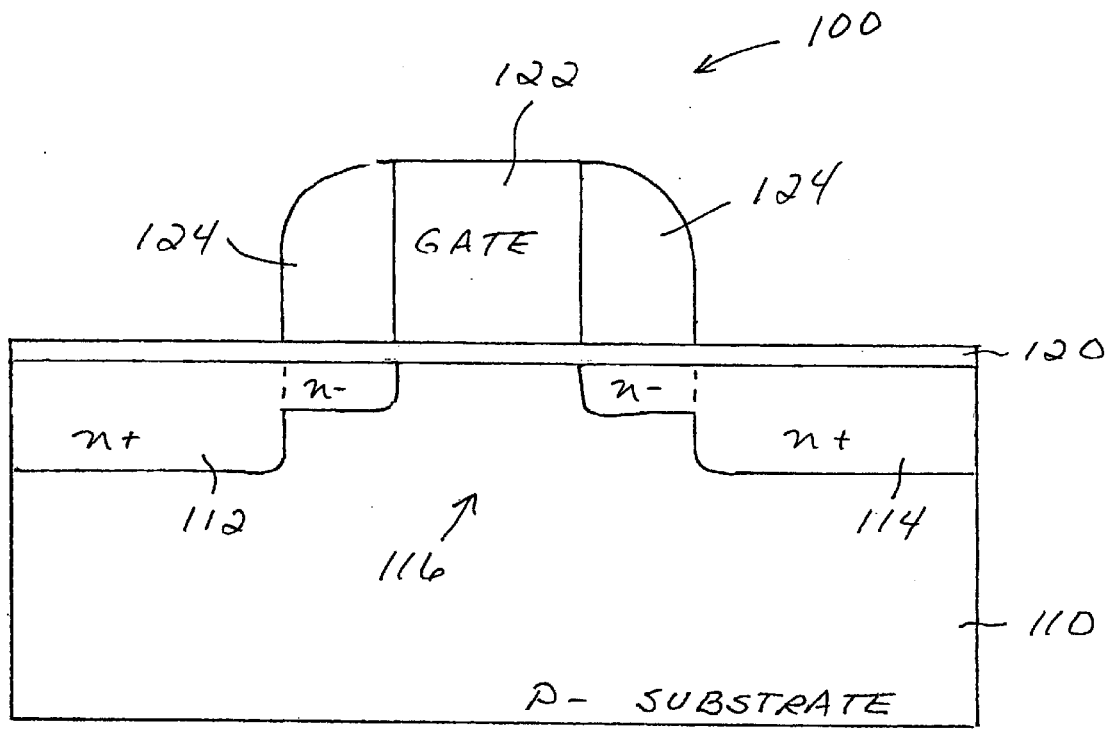
FIG. 1 is a cross-section diagram illustrating a standard MOS transistor 100.
Figure 2:
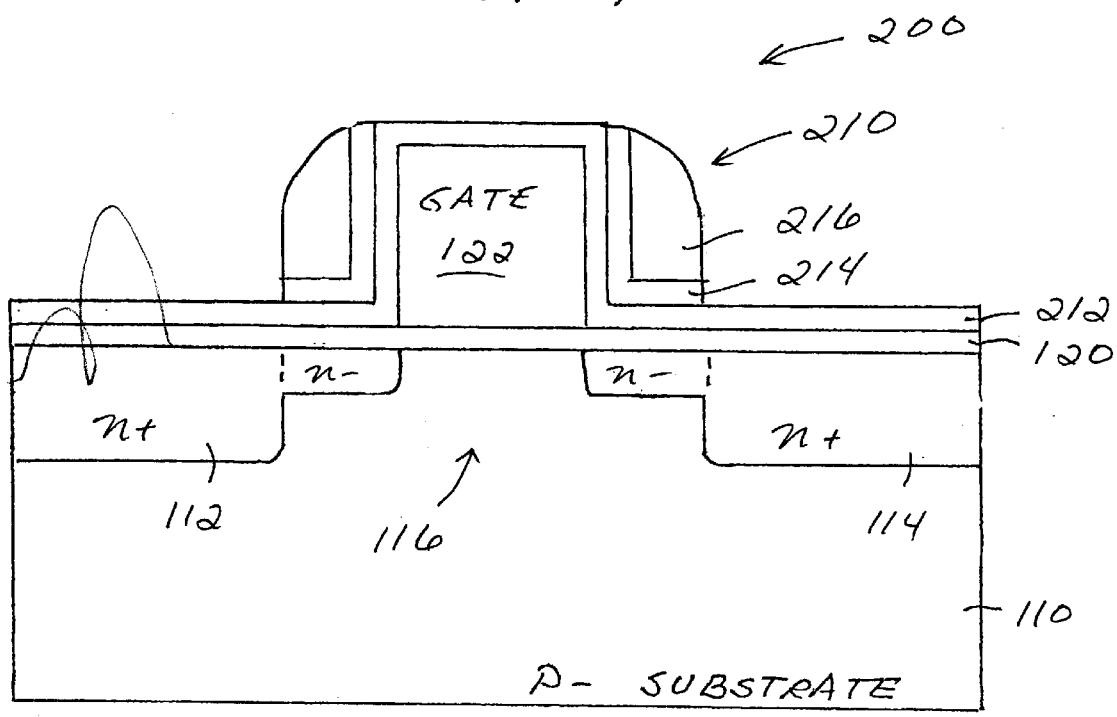
FIG. 2 is a cross-section diagram illustrating a MOS transistor 200 with a prior-art complex side wall spacer.
Figure 3A:
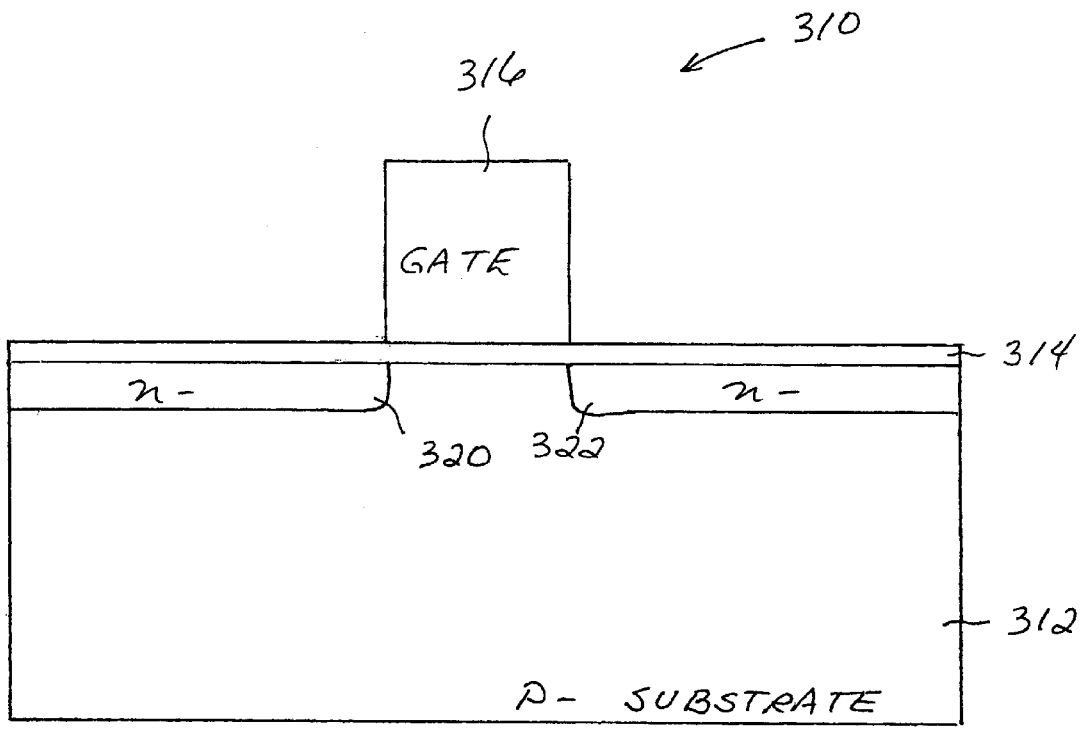
FIGS. 3A–3D are cross-sectional diagrams illustrating a prior-art method 300 of forming transistor 200.
Figure 3B:
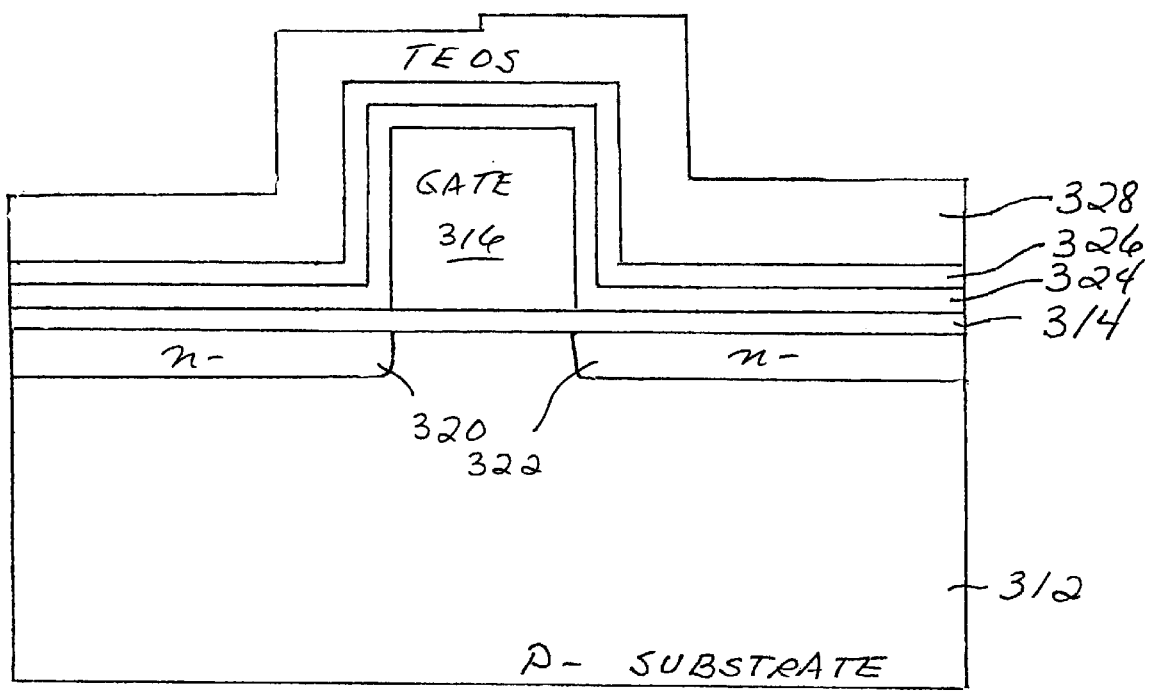
Figure 3C:
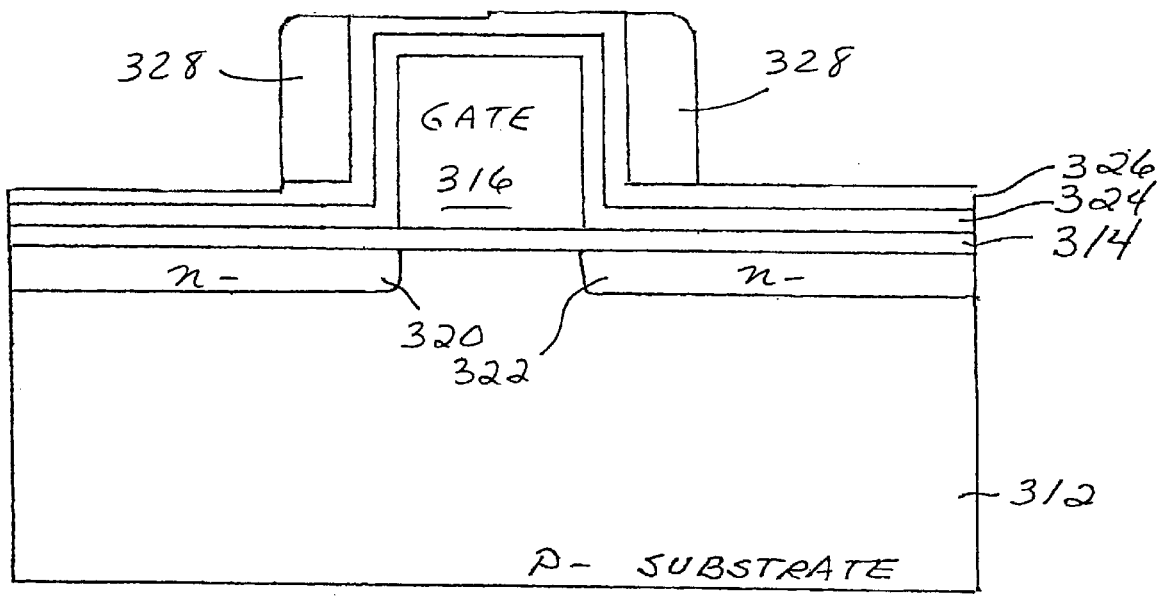
Figure 3D:
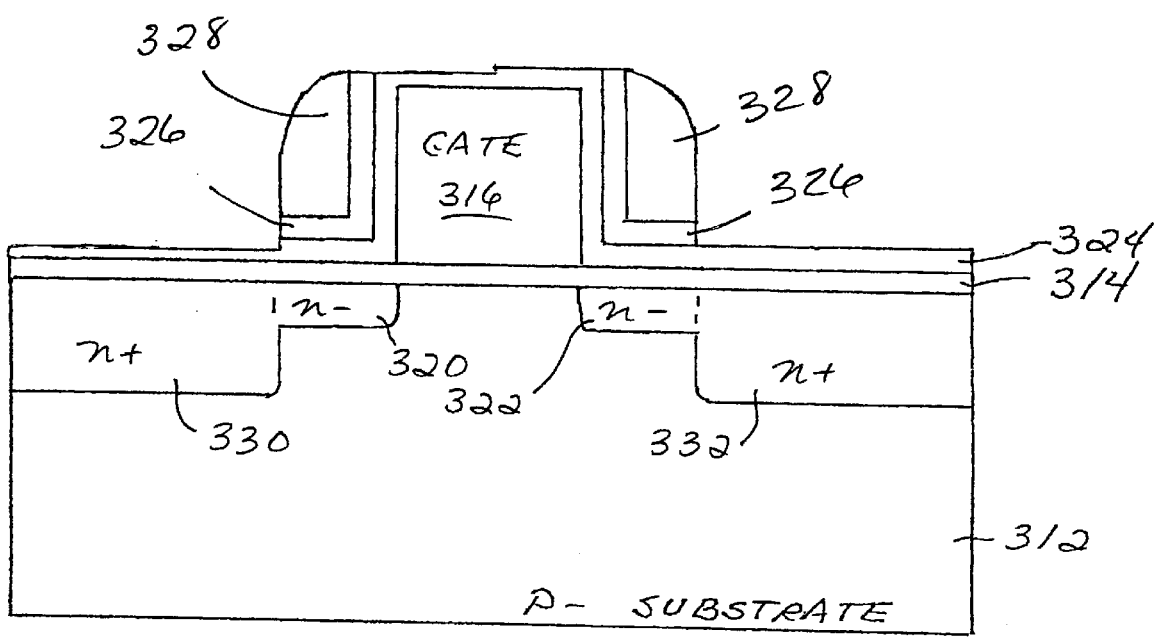
Figure 4A:
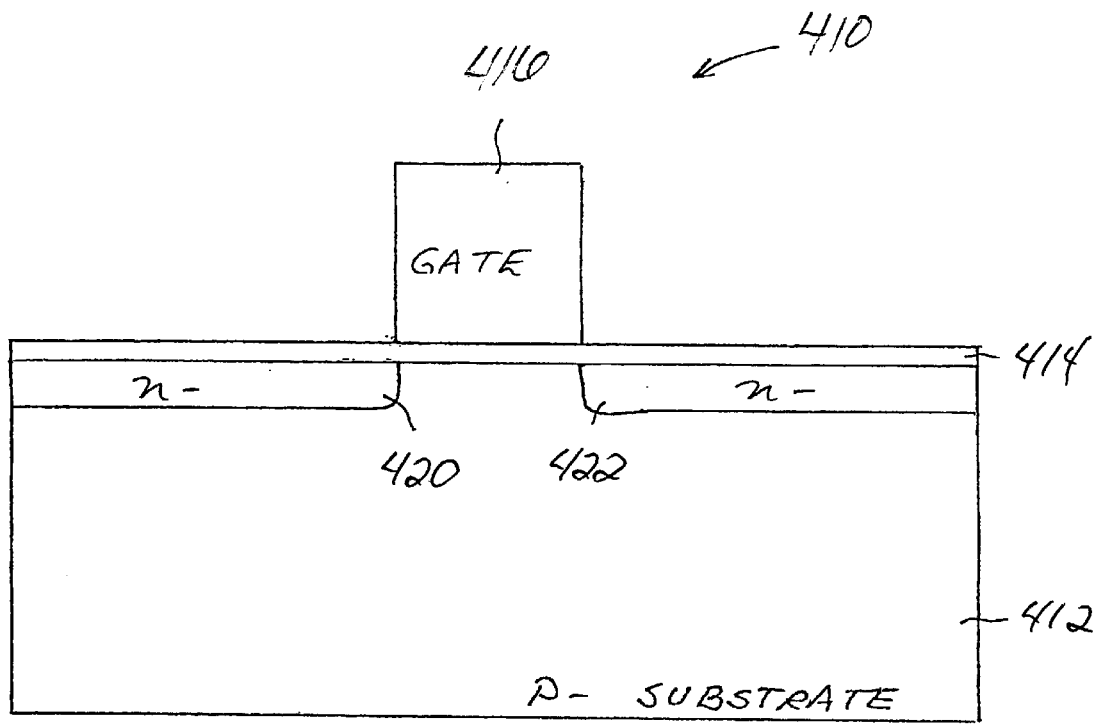
FIGS. 4A–4D are cross-sectional diagrams illustrating a method 400 of forming transistor 200 in accordance with the present invention.

As shown in FIG. 4A, method 400 utilizes a wafer 410 that has been partially processed to have a p- semiconductor material 412, such as a substrate or a well, and a layer of gate oxide 414 that is formed on material 412. In addition, wafer 410 has also been partially processed to have a gate 416 that is formed on gate oxide layer 414.

Figure 4B:
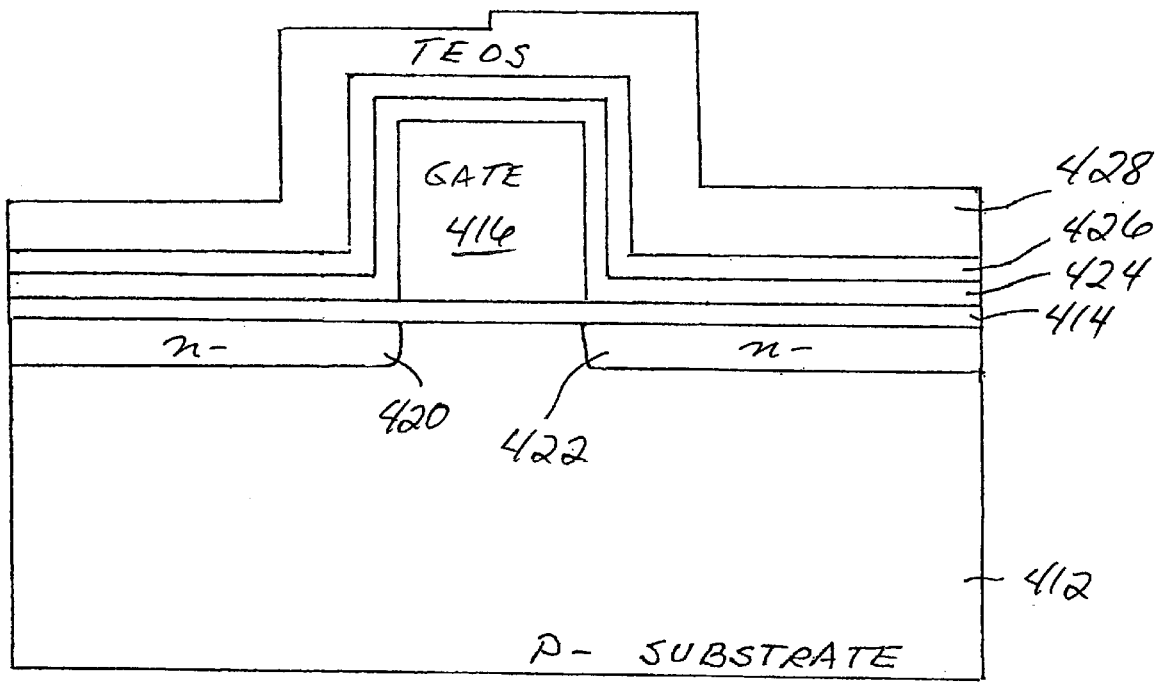

As further shown in FIG. 4A, method 400 begins by implanting material 412 and gate 416 with an n-type dopant to form n-source and drain regions 420 and 422 in material 412, and dope gate 416. Following this, as shown in FIG. 4B, a layer of tetraethylorthosilicate (TEOS) 424 approximately 300Å thick is chemical-vapor deposited on oxide layer 414 and gate 416.

Next, a layer of nitride 426 approximately 300Å–500Å thick is chemical-vapor deposited on TEOS layer 424. Once nitride layer 426 has been formed, a layer of TEOS 428 approximately 5,000Å thick is chemical vapor deposited on nitride layer 426. The actual thickness of each deposited layer (TEOS layer 424, nitride layer 426, and TEOS layer 428) can vary from wafer to wafer and lot to lot by up to 10%. Since TEOS layer 428 is the thickest, this is most pronounced in TEOS layer 428. This is illustrated in FIG. 4B with two different thicknesses of TEOS layer 428.

Figure 4C:
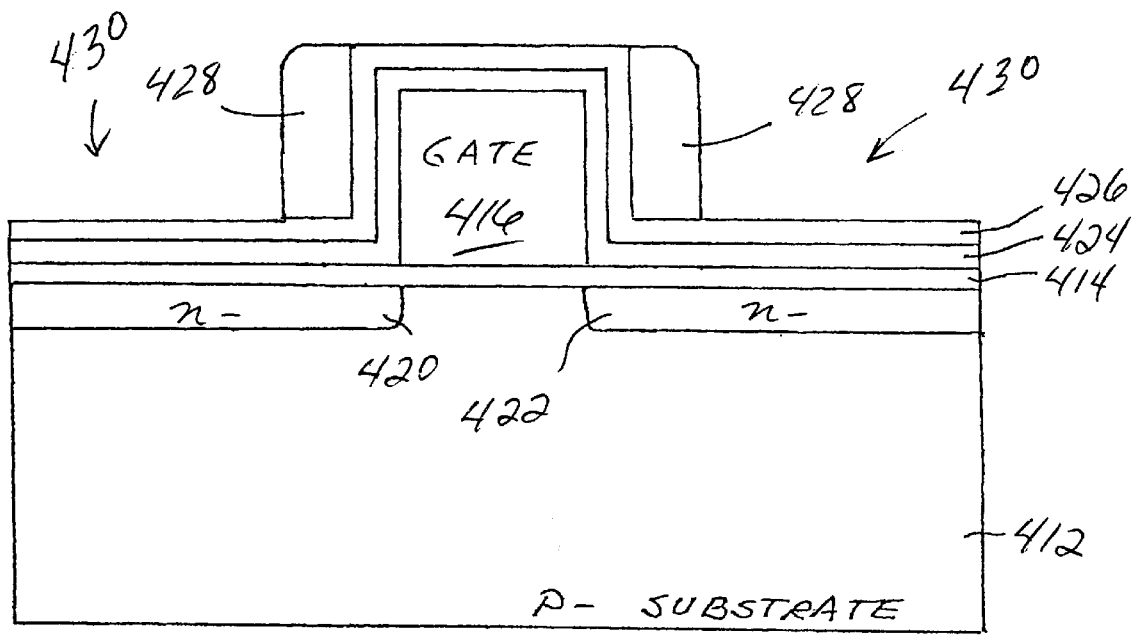

Next, wafer 410 is placed in an etch chamber, such as a TEL Unity IIe plasma etcher manufactured by Tokyo Electron Limited, and the etch chemistry (e.g., type of gas, gas pressure, voltage) is set to etch TEOS. Following this, as shown in FIG. 4C, TEOS layer 428 is anisotropically etched to remove TEOS layer 428 from nitride layer 426 over gate 416 and a peripheral region 430 of substrate 412.

TEOS layer 428 can be etched with a single etch chemistry, or with two. With two chemistries, the first chemistry has little selectivity with the underlying material but good etching characteristics, and the second chemistry has good selectivity with the underlying material but poor etching characteristics, such as sloped profiles.

With a two chemistry process, the etch chemistry is changed when the etch is close to reaching the underlying material so that a chemistry with more selectivity to the underlying material can be utilized. With the second chemistry, the material to be etched continues to be etched while relatively little of the underlying material is etched.

In accordance with the present invention, an optical endpoint detection system, such as the TEL EPD 202 manufactured by Tokyo Electron Limited, is utilized to monitor the optical components of the plasma during the etch of TEOS layer 428. In a first embodiment, light which has a wavelength of approximately 387 nm is monitored during the TEOS etch. When the intensity of the light at 387 nm increases, indicating that nitride is being etched, the etch is stopped.

In a second embodiment, light which has a wavelength of approximately 440 nm is monitored during the TEOS etch. Light of this wavelength is present when SiF or SiN is present in the plasma, indicating that TEOS is being etched. When the intensity of the light at 440 nm decreases, indicating that TEOS is no longer being etched, the etch is stopped.

In addition, light having a wavelength within the range of approximately 226 nm to 260 nm is also monitored as a baseline signal. The baseline signal is used to compensate for a decrease in signal strength as the window in the chamber gets dirty over a wet-clean cycle. In some cases, depending on the etch, the chamber must be opened so all of the components can be cleaned. The clean window provides a good look at the plasma at full strength. As the window and the chamber get dirty, a baseline range that does not change much with etch chemistry is monitored to compensate for the window clouding.

Figure 4D:
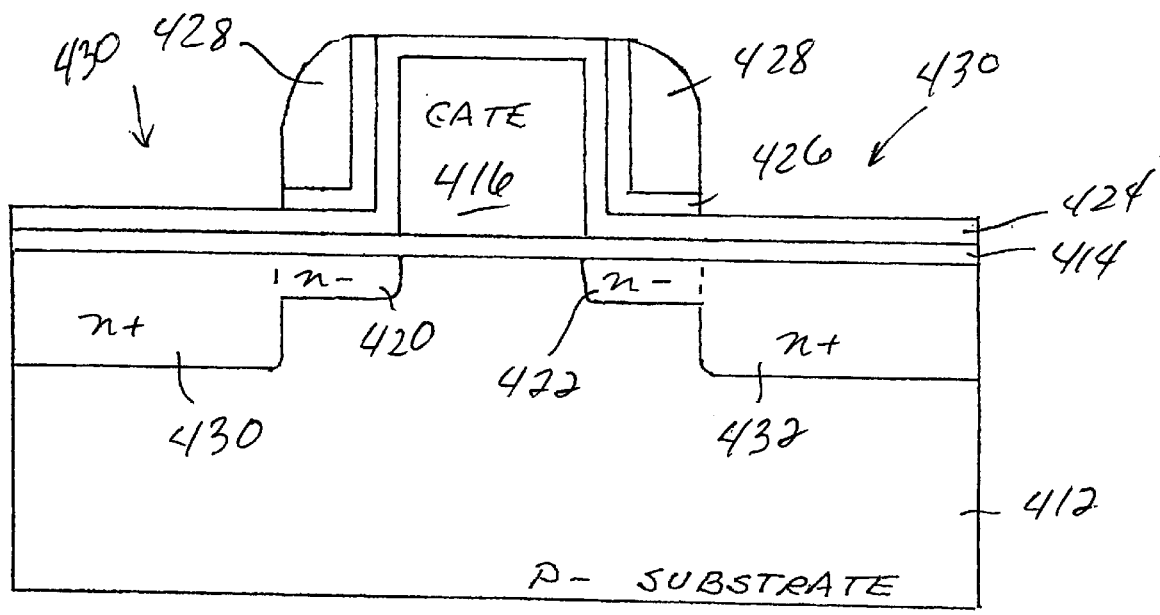

Following this, the etch chemistry is changed (e.g., type of gas, gas pressure, voltage) to etch nitride. After the etch chemistry has been changed, as shown in FIG. 4D, nitride layer 426 is anisotropically etched to remove nitride layer 426 from TEOS layer 424 over gate 416 and peripheral region 430 of material 412. Nitride layer 426 can also be etched with a single etch chemistry, or with two.

In further accordance with the present invention, the optical endpoint detection system is utilized to monitor the optical components of the plasma during the etch of nitride layer 426. In the first embodiment, when the intensity of the light at 387 nm decreases, indicating that nitride is no longer being etched, the etch is stopped. In the second embodiment, when the intensity of the light at 440 nm increases, indicating that TEOS is being etched and nitride is no longer being etched, the etch is stopped. As above, a baseline signal is also monitored in both embodiments.

Figure 5A:
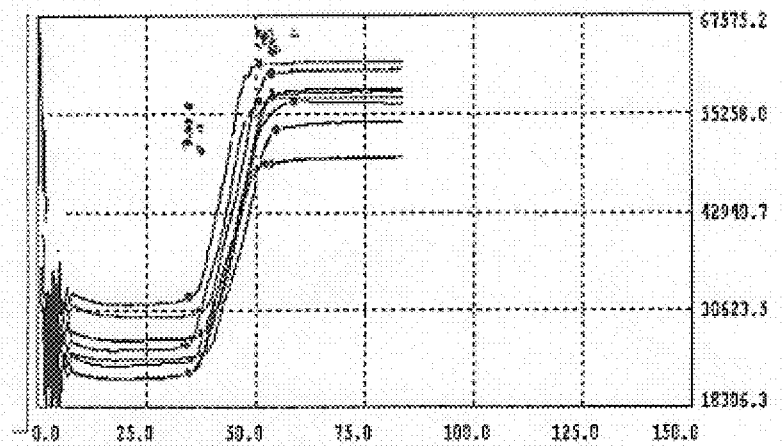
FIGS. 5A and 5B are optical endpoint detection (EPD) graphs illustrating the change in light intensity that results from a film being removed in accordance with the present invention.
Figure 5B:
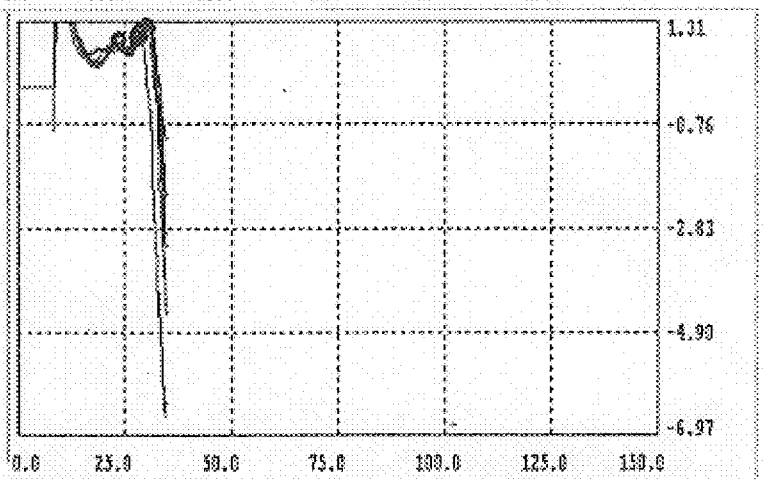

FIGS. 5A and 5B show optical endpoint detection (EPD) graphs that illustrate the change in light intensity that results from a film being removed in accordance with the present invention. FIG. 5A illustrates the first endpoint at the top TEOS/nitride interface. FIG. 5B illustrates the second endpoint at the bottom nitride/TEOS interface.

As shown in FIGS. 5A and 5B, strong changes in the plasma enable the present invention to stop the etch at the appropriate film interface. The EPD traces shown in FIGS. 5A and 5B indicate sufficiently strong differentiation between the optical signals in the adjacent layers to determine endpoint times easily.

Alternately, two different wavelengths of light can also be used. In a two-wavelength embodiment, light which has a wavelength of approximately 440 nm can be monitored during the TEOS etch. When the intensity of the light at 440 nm decreases, indicating that TEOS is no longer being etched, the etch is stopped. Following this, the etch chemistry is changed to etch nitride, and the nitride layer is etched by monitoring the intensity of the light at 387 nm. Alternately, light at 387 nm can be monitored during the etch of TEOS layer 428, while light at 440 nm is monitored during the etch of nitride layer 426.

Following the etch of nitride layer 426, TEOS layer 424 is implanted to form n+ source and drain regions 430 and 432 in material 412, and again dope gate 416. Once source and drain regions 430 and 432 have been formed, method 400 continues with conventional steps. Thus, a method of forming a complex side wall spacer using double optical endpoint detection has been described.

One of the advantages of the present invention is that double optical endpoint detection substantially prevents non-uniformities from the previous layers from being introduced into the remaining layer of TEOS (TEOS layer 424). Uniformity (or range) is measured as the variation of etch rate over the wafer as a percent of the mean etch rate. For example, with an etch rate of 400 nm/min+/−50 nm/min, the +/−50 nm/min is the uniformity. Although referred to as uniformity, this is actually the non-uniformity. As a result, the present invention increases uniformity, or decreases non-uniformity, over the wafer because each step is more closely controlled.

In addition, the uniformity improves from wafer-to-wafer because the optical endpoints allow the etch to be tailored to the incoming film thicknesses and the etch behavior of the chamber. As shown in FIG. 4D, TEOS layer 424 has largely the same thickness over both source and drain regions 430 and 432 even though TEOS layer 428 had differing thicknesses.

Verification of module improvement using the endpoint method of the present invention, instead of a timed etch, was collected by in-line Tencor 1270 TUV measurements and Scanning Electron Microscope (SEM) cross-sections. The present invention improved etch uniformity by 44%, thereby implying an increase in the repeatability of the gate spacer and overall reliability of the product.

Figures 6A, 6B:
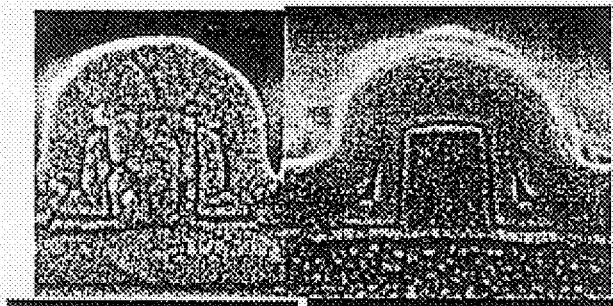
FIGS. 6A and 6B are edge and center cross-sectional SEM views, respectively, illustrating the results of a conventional timed etch.

FIGS. 6A and 6B show edge and center cross-sectional SEM views, respectively, which illustrate the results of a conventional timed etch. As shown in FIGS. 6A and 6B, the timed etch did not stop on the lower nitride/TEOS interface and continued to etch through the barrier TEOS layer into the silicon below. This can cause transistor leakage that can degrade the device and decrease the overall reliability of the product.

Figures 7A, 7B:
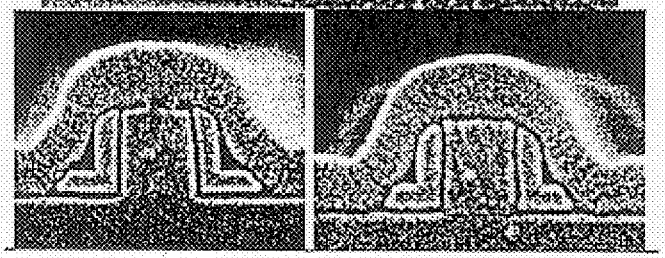
FIGS. 7A and 7B are edge and center cross-sectional SEM views, respectively, illustrating the results of the present invention.

FIGS. 7A and 7B show edge and center cross-sectional SEM views, respectively, which illustrate the results of the present invention. As shown in FIGS. 7A and 7B, the method of the present invention provides sufficient overetch control.

Figure 8:
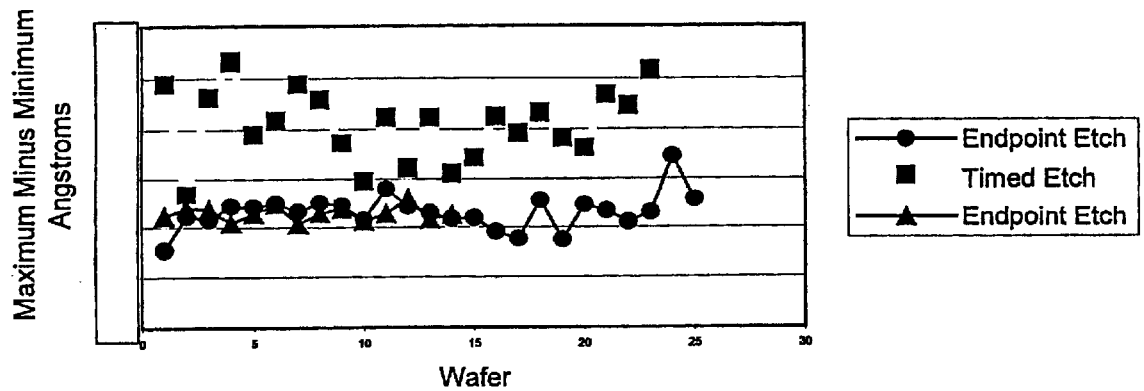
FIG. 8 is a graph illustrating range variations of the remaining TEOS after the etches comparing double optical endpoint detected (present invention) vs. timed etches for a wafer range over nine sites.
Figure 9:
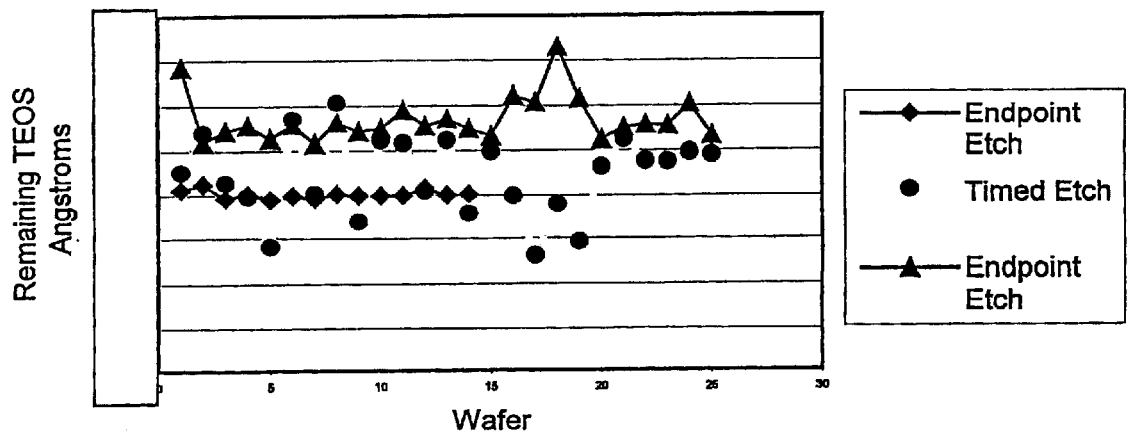
FIG. 9 is a graph illustrating lot to lot variations of the remaining TEOS after the etches comparing double optical endpoint detected (present invention) vs. timed etches for wafer average of nine measurement points.
Figure 1:
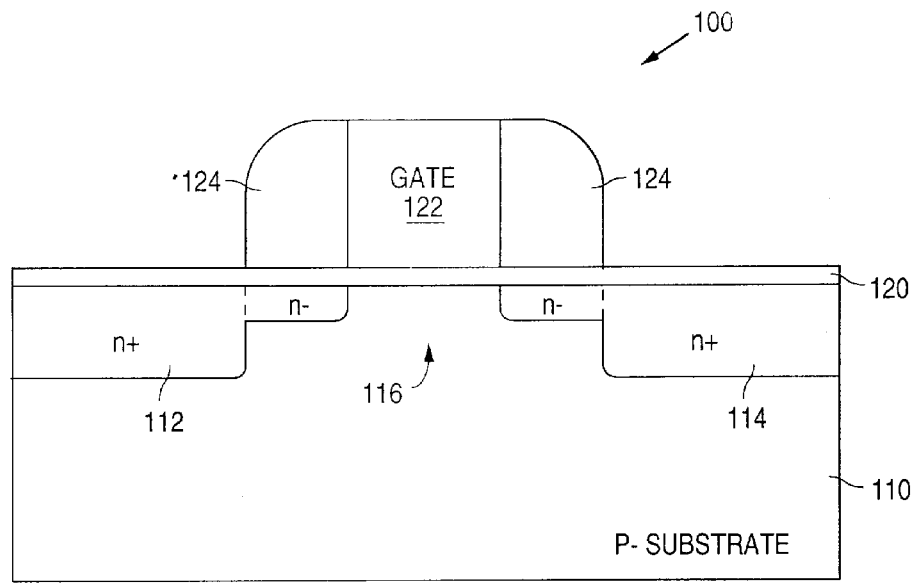
Figure 2:
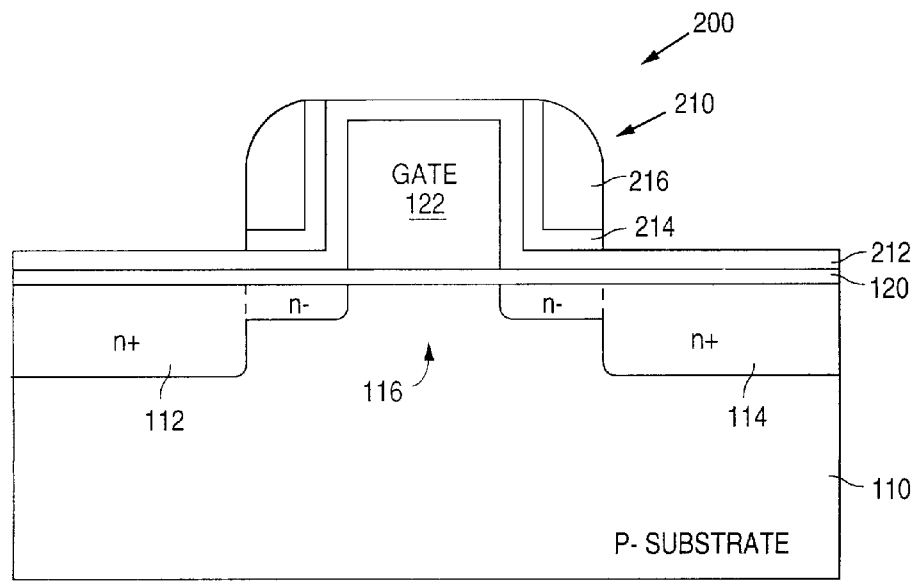
Figure 3A:
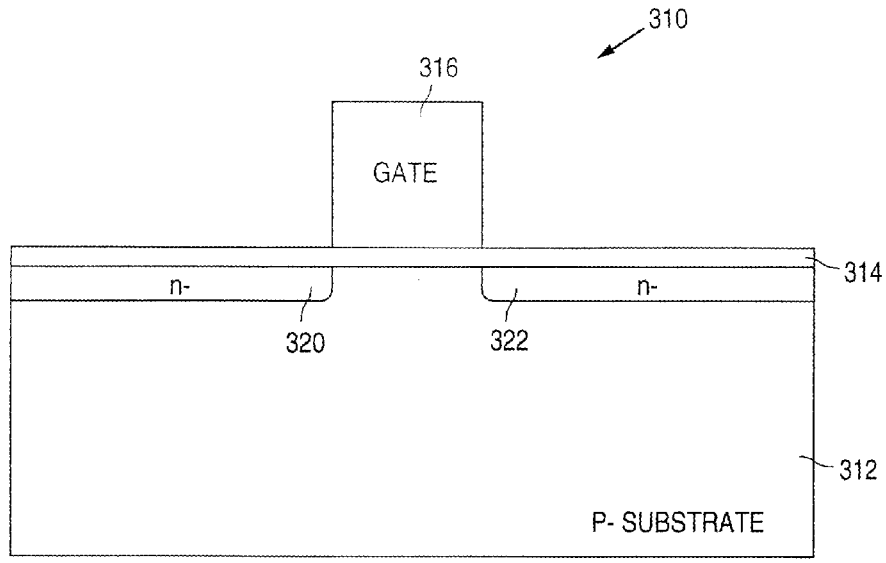
Figure 3B:
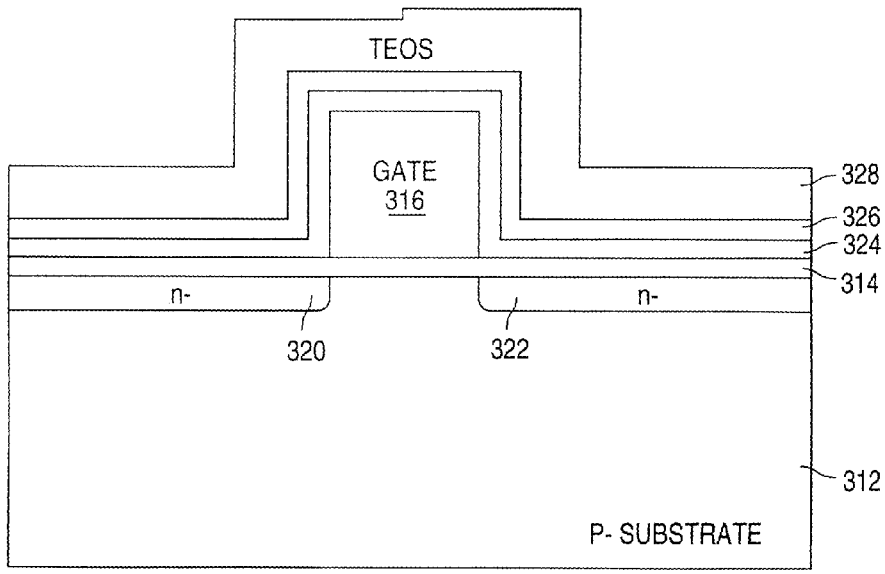
Figure 3C:
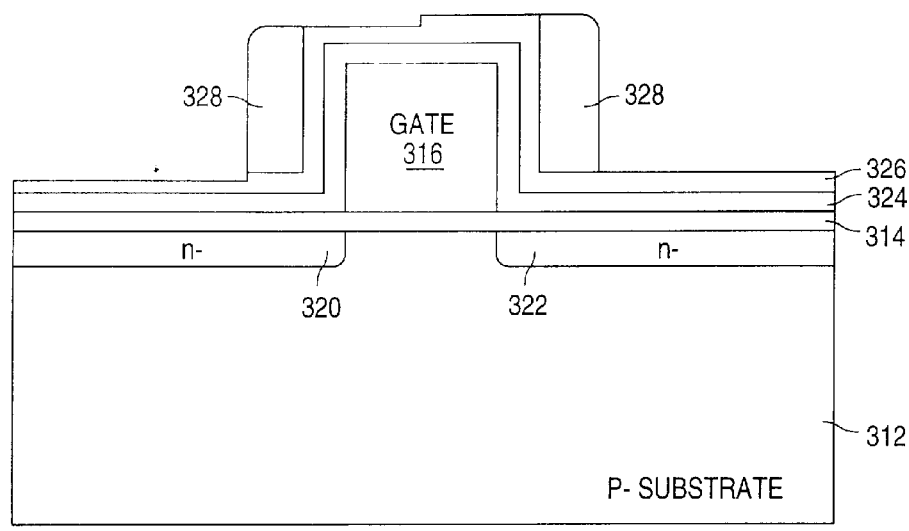
Figure 3D:
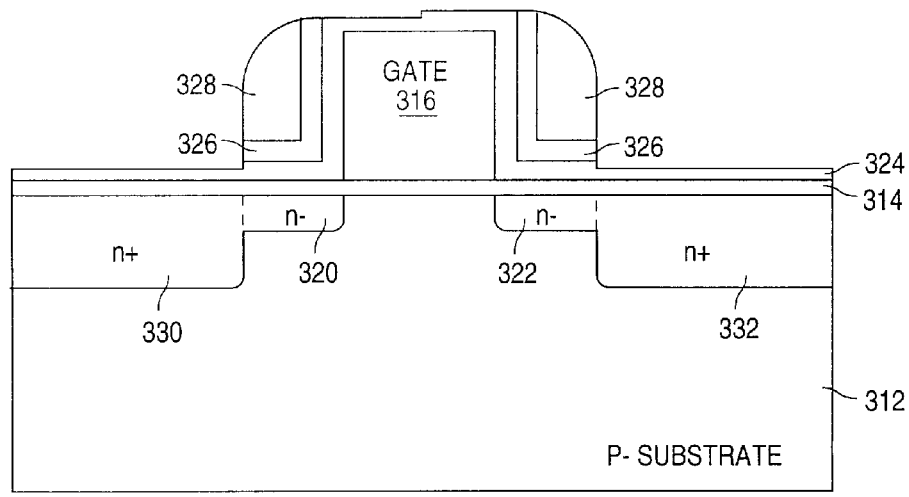
Figure 4A:
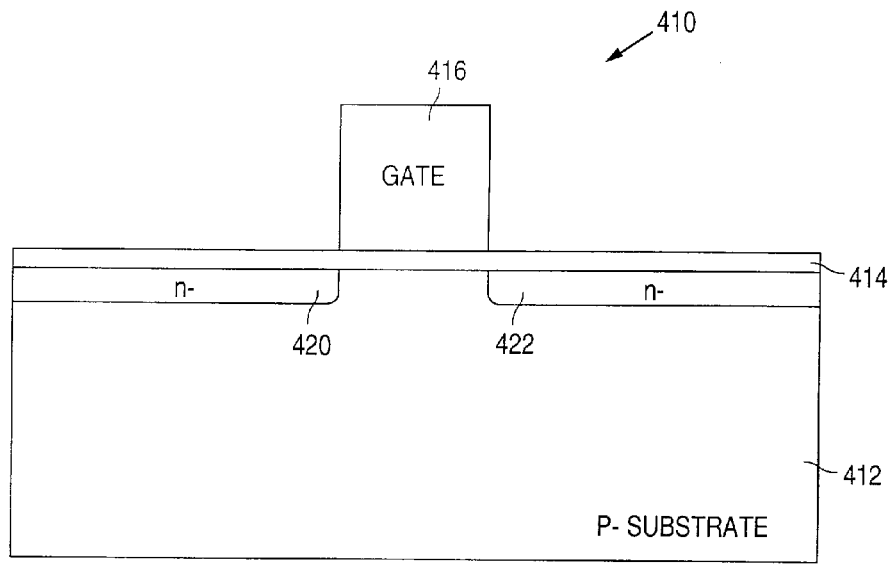
Figure 4B:
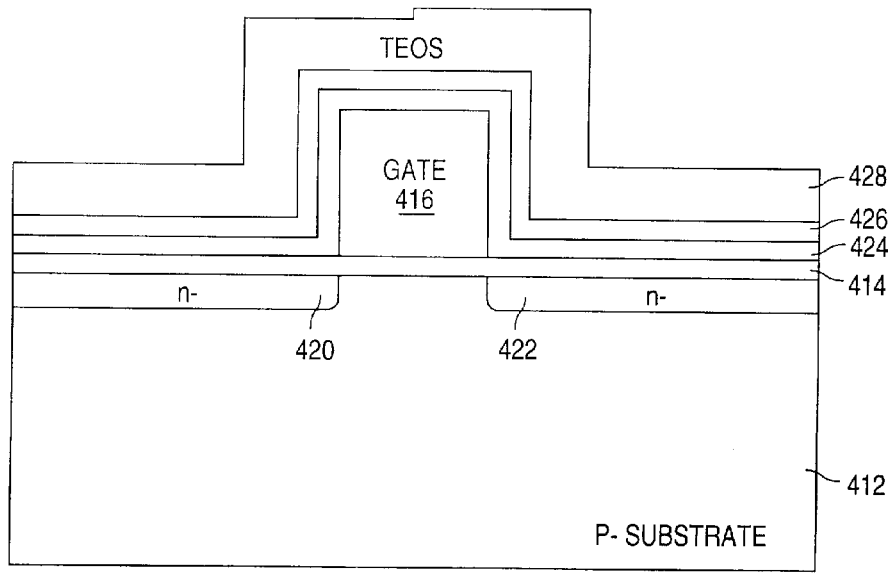
Figure 4C:
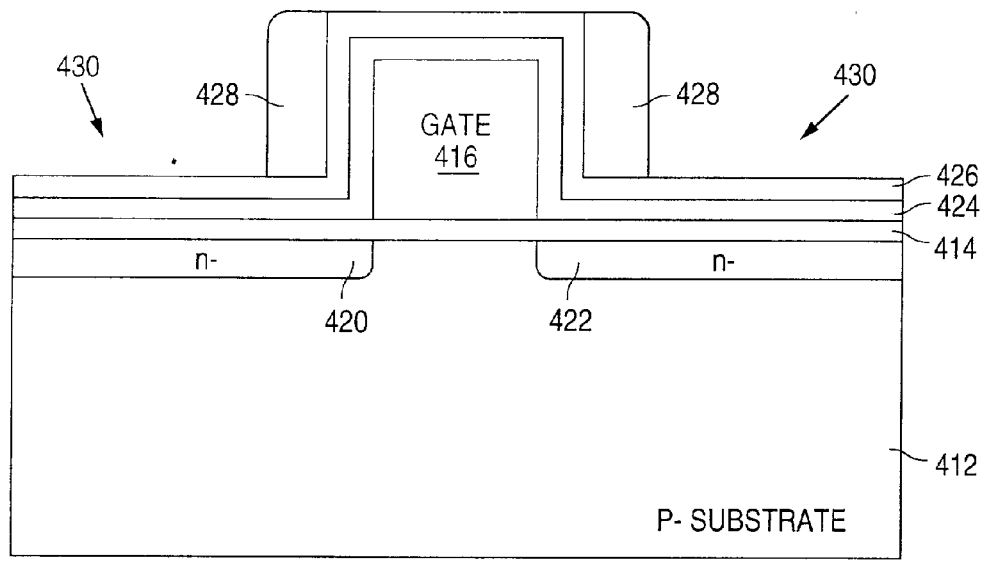
Figure 4D:
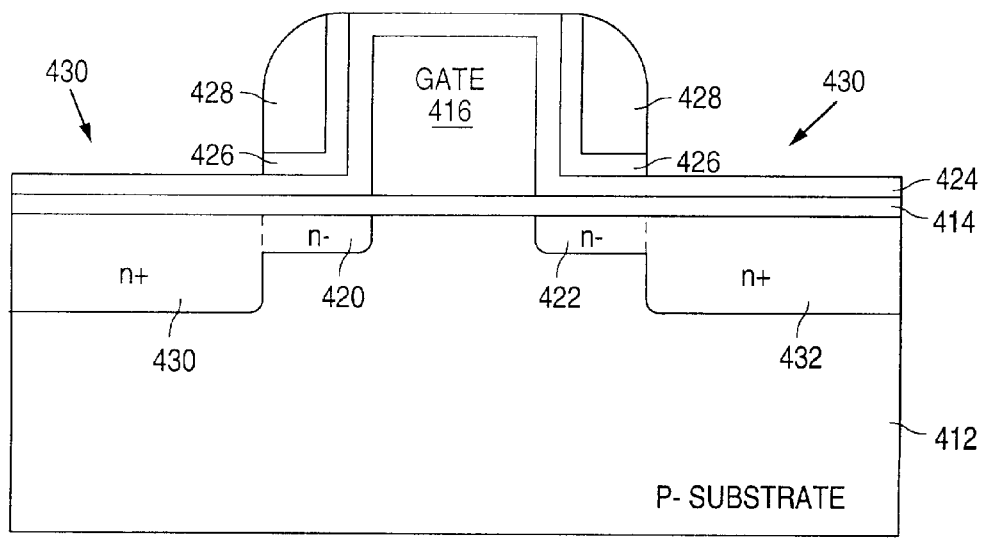
Figure 5A:
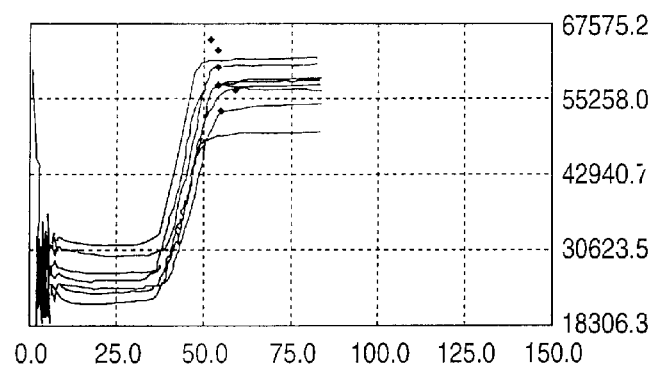
Figure 5B:
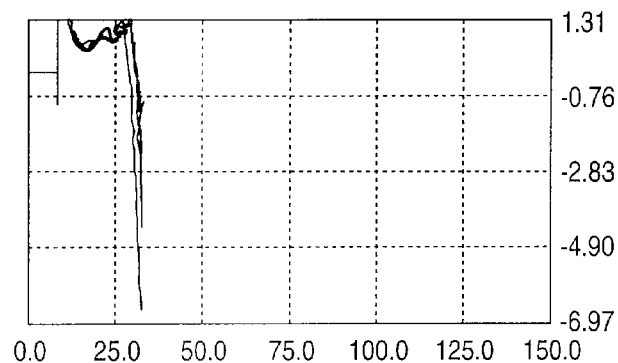
Figure 6A:
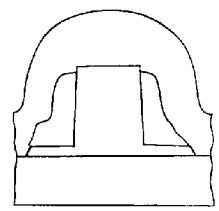
Figure 6B:
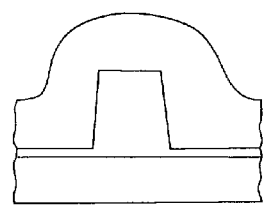
Figure 7A:
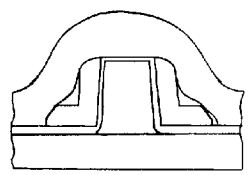
Figure 7B:
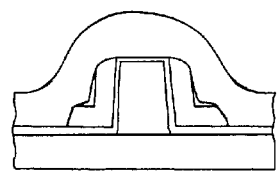
Figure 8:
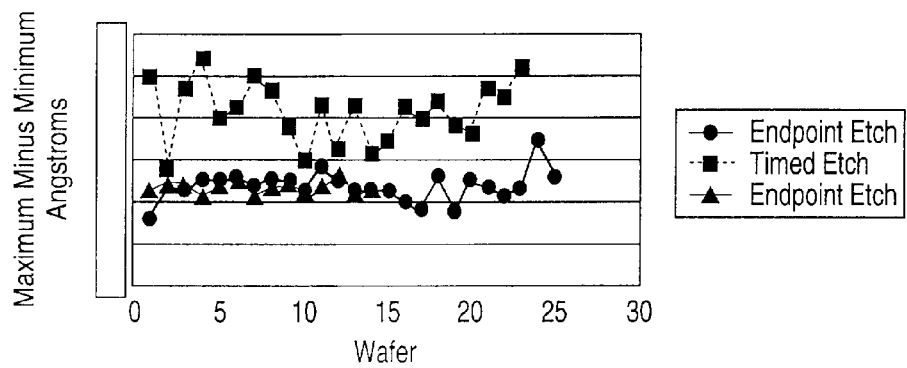
Figure 9:
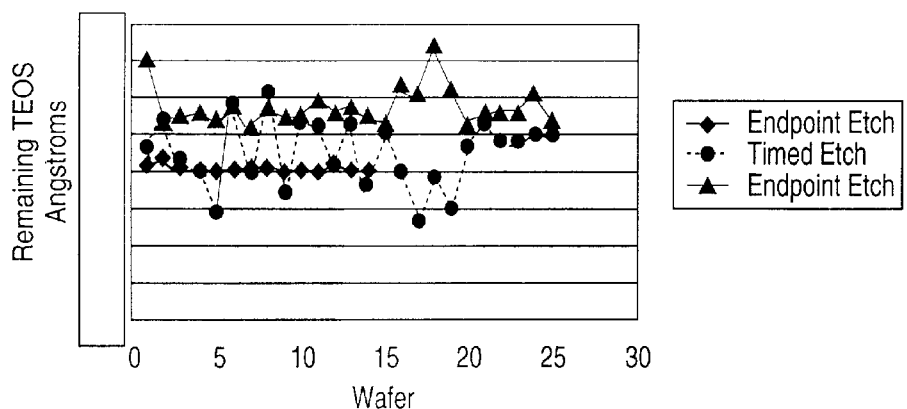

FIG. 8 shows a graph that illustrates Range variations of the remaining TEOS after the etches comparing double optical endpoint detected (present invention) vs. timed etches for a wafer range over nine sites. FIG. 9 shows a graph that illustrates lot to lot variations of the remaining TEOS after the etches comparing double optical endpoint detected (present invention) vs. timed etches for wafer average of nine measurement points.

As shown in FIGS. 8 and 9, in-line measurements of remaining TEOS after an etch indicate a 44% increase in overetch uniformity across a wafer, from wafer to wafer, and from lot to lot. In addition, FIGS. 8 and 9 show that the present method provides tighter control across the wafer, from wafer to wafer, and from lot to lot. (FIGS. 8 and 9 represent the 387 nm signal intensity divided by the intensity of the baseline signal.)

The double optical endpoint method of the present invention reliably minimizes variations from incoming film thickness. This is done by accurately detecting the top TEOS/nitride interface, and again detecting the bottom nitride/TEOS interface, thereby repeatably leaving the desired amount of TEOS after forming the complex spacer structure. This etch precision improves the overall device and product reliability.

It should be understood that various alternatives to the invention described herein may be employed in practicing the invention. For example, the present invention applies generally to etching multiple different layers of material using optical endpoint detection for the last n etches where n is two or more. Thus, it is intended that the following claims define the scope of the invention and that methods and structures within the scope of these claims and their equivalents be covered thereby.

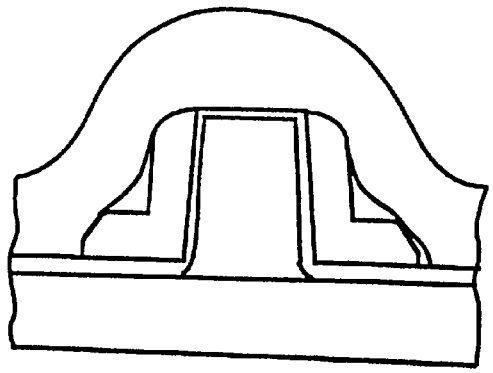

What is claimed is:

1. A method of forming a semiconductor device on a semiconductor material of a first conductivity type, the method comprising the steps of:

forming a first layer of material on the semiconductor material;

forming a second layer of material on the first layer of material;

forming a third layer of material on the second layer of material;

etching the third layer of material until a first wavelength of light changes from a first intensity to a second intensity; and etching the second layer of material until a second wavelength of light changes from a third intensity to a fourth intensity.

2. The method of claim 1 wherein the third layer of material is etched in an etching chamber that has an etching chemistry, the etching chemistry being set to etch the third layer of material, and wherein the second layer of material is etched in the etching chamber, and the etching chemistry is changed to etch the second layer of material in response to the first wavelength of light changing from the first intensity to the second intensity.

3. The method of claim 1 wherein the first wavelength and the second wavelength are equal.

4. The method of claim 3 wherein the first intensity is less than the second intensity.

5. The method of claim 4 wherein the third intensity is greater than the fourth intensity.

6. The method of claim 3 the first intensity is greater than the second intensity.

7. The method of claim 6 wherein the third intensity is less than the fourth intensity.

8. The method of claim 1 wherein the first wavelength and the second wavelength are unequal.

9. The method of claim 8 wherein the first intensity is less than the second intensity.

10. The method of claim 9 wherein the third intensity is greater than the fourth intensity.

11. The method of claim 8 wherein the first intensity is greater than the second intensity.

12. The method of claim 11 wherein the third intensity is less than the fourth intensity.

13. A method of forming a semiconductor device on a wafer, the wafer having a semiconductor material of a first conductivity type, a layer of gate oxide formed on semiconductor material, and a gate formed on the layer of gate oxide, the method comprising the steps of:

forming a first layer of material on the layer of gate oxide and the gate;

forming a second layer of material on the first layer of material;

forming a third layer of material on the second layer of material;

etching the third layer of material until a first wavelength of light changes from a first intensity to a second intensity;

etching the second layer of material until a second wavelength of light changes from a third intensity to a fourth intensity to form a side wall spacer that adjoins the gate; and implanting a dopant to form source and drain regions in the semiconductor material and dope the gate, the side wall spacer protecting a region of semiconductor material underlying the side wall spacer from the dopant.

14. The method of claim 13 wherein the third layer of material is etched in an etching chamber that has etching conditions, the etching conditions being set to etch the third layer of material, and wherein the second layer of material is etched in the etching chamber, and the etching conditions are changed to etch the second layer of material in response to the first wavelength of light changing from the first intensity to the second intensity.

15. The method of claim 13 wherein the first wavelength and the second wavelength are equal.

16. The method of claim 15 wherein the first intensity is less than the second intensity.

17. The method of claim 16 wherein the third intensity is greater than the fourth intensity.

18. The method of claim 15 the first intensity is greater than the second intensity.

19. The method of claim 18 wherein the third intensity is less than the fourth intensity.

20. The method of claim 13 wherein the first wavelength and the second wavelength are unequal.

21. The method of claim 20 wherein the first intensity is less than the second intensity.

22. The method of claim 21 wherein the third intensity is greater than the fourth intensity.

23. The method of claim 20 wherein the first intensity is greater than the second intensity.

24. The method of claim 23 wherein the third intensity is less than the fourth intensity.

* * * * *

UNITED STATES PATENT AND TRADEMARK OFFICE
CERTIFICATE OF CORRECTION

PATENT NO. : 6,376,262 B1
DATED : April 23, 2002
INVENTOR(S) : Kempa et al.

It is certified that error appears in the above-identified patent and that said Letters Patent is hereby corrected as shown below:

Title page,
Delete title page and substitute attached title page.

Drawings,
Please delete drawing sheets Figures 1-9 and insert replacement drawing sheets Figures 1-9.

Signed and Sealed this

Twentieth Day of August, 2002

Attest:

Attesting Officer

JAMES E. ROGAN
Director of the United States Patent and Trademark Office

(12) United States Patent
Kempa et al.

(10) Patent No.: US 6,376,262 B1
(45) Date of Patent: Apr. 23, 2002

(54) METHOD OF FORMING A SEMICONDUCTOR DEVICE USING DOUBLE ENDPOINT DETECTION

(75) Inventors: Danielle Ki'ilani Kempa, Ogunquit, ME (US); Sandra Hyland, Falls Church, VA (US)

(73) Assignees: National Semiconductor Corporation, Santa Clara, CA (US); Tokyo Electron Limited (JP)

(*) Notice: Subject to any disclaimer, the term of this patent is extended or adjusted under 35 U.S.C. 154(b) by 0 days.

(21) Appl. No.: 09/872,636

(22) Filed: May 31, 2001

(51) Int. Cl.[7] ............................................. H01L 21/00
(52) U.S. Cl. ...................................................... 438/8
(58) Field of Search ..................... 438/8, 5–7, 9–13, 438/14–18, 800

(56) References Cited

U.S. PATENT DOCUMENTS 4,675,072 A * 6/1987 Bennett et al. ............ 156/626

OTHER PUBLICATIONS

Derwent Acc No. 1987-192034 Bennet, R.S. et al. "Dual-layer plasma etching end point detection appts.—uses laser irradiation and sec. emission detection of a minority species . . .".*

Unity, EPD202 Functional Specification, Rev. 2.0., pp. 1–40. No date.

C.K. Hanish et al., "Modeling and Algorithm Development for Automated Optical Endpointing of an HBT Emitter Etch", Journal of Electronic Materials, vol. 26, No. 12, 1997, pp. 1401–1408.

G.G. Gifford, "Applications of Optical Emission Spectroscopy in Plasma Manufacturing Systems", SPIE vol. 1392 Advanced Techniques for Integrated Circuit Processing, 1990, pp. 454–465.

* cited by examiner

*Primary Examiner*—Charles Bowers
*Assistant Examiner*—Craig Thompson
(74) *Attorney, Agent, or Firm*—Pillsbury Winthrop LLP

(57) ABSTRACT

An optical endpoint system controls the overetching of a semiconductor device by using double optical endpoint detection. With a complex spacer, the system monitors the chemistry change at both the top TEOS/nitride interface and the bottom nitride/TEOS interface. This double optical endpoint method reduces the possibility of overetching the layers regardless of the variations in the thickness of the incoming film or the etching characteristics of the etch chamber.

24 Claims, 7 Drawing Sheets